US009240768B2

(12) United States Patent
Nishihara et al.

(10) Patent No.: US 9,240,768 B2
(45) Date of Patent: Jan. 19, 2016

(54) DUPLEXER WITH TRANSMISSION AND RECEPTION FILTERS EACH INCLUDING RESONATORS FORMED ON DIFFERENT CHIPS

(75) Inventors: Tokihiro Nishihara, Tokyo (JP); Shinji Taniguchi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 380 days.

(21) Appl. No.: 13/610,393

(22) Filed: Sep. 11, 2012

(65) Prior Publication Data

US 2013/0127565 A1 May 23, 2013

(30) Foreign Application Priority Data

Nov. 22, 2011 (JP) ................................ 2011-255545

(51) Int. Cl.
*H03H 9/70* (2006.01)
*H03H 9/72* (2006.01)
*H03H 9/02* (2006.01)
*H03H 9/60* (2006.01)
(Continued)

(52) U.S. Cl.
CPC ....... *H03H 9/02102* (2013.01); *H03H 9/02834* (2013.01); *H03H 9/542* (2013.01); *H03H 9/605* (2013.01); *H03H 9/6483* (2013.01); *H03H 9/706* (2013.01); *H03H 9/725* (2013.01)

(58) Field of Classification Search
CPC ... H03H 9/706; H03H 9/725; H03H 9/02102; H03H 9/54; H03H 9/568; H03H 9/605; H03H 9/64; H03H 9/6423; H03H 9/6483; H03H 9/542; H03H 9/02834
USPC .............. 333/133, 189–196; 310/346, 313 B, 310/313 D
See application file for complete search history.

(56) References Cited

U.S. PATENT DOCUMENTS 4,456,850 A 6/1984 Inoue et al.
5,726,610 A * 3/1998 Allen et al. .................. 333/133
(Continued)

FOREIGN PATENT DOCUMENTS

CN 1503451 A 6/2004
CN 1543063 A 11/2004
(Continued)

OTHER PUBLICATIONS

English language machine translation of JP 7-283688, published Oct. 27, 1995, 5 pages.*
(Continued)

*Primary Examiner* — Barbara Summons
(74) *Attorney, Agent, or Firm* — Chen Yoshimura LLP

(57) ABSTRACT

A duplexer includes a transmission filter and a reception filter having different passbands, wherein: first resonators that are series resonators or parallel resonators included in the transmission and reception filters so as to form a skirt characteristic at a guard band side are a temperature compensated type piezoelectric thin film resonator or a surface acoustic wave resonator using Love waves, and second resonators that form a skirt characteristic at an opposite side to the guard band are one of a temperature non-compensated type piezoelectric thin film resonator, a surface acoustic wave resonator using a lithium tantalate substrate or a substrate made by bonding a lithium tantalate substrate on a sapphire substrate, and a surface acoustic wave resonator using Love waves.

11 Claims, 13 Drawing Sheets

(51) Int. Cl.
*H03H 9/64* (2006.01)
*H03H 9/54* (2006.01)

(56) References Cited

U.S. PATENT DOCUMENTS

| | | | | |
|---|---|---|---|---|
| 6,424,238 | B1 * | 7/2002 | Penunuri | 333/187 |
| 6,462,631 | B2 * | 10/2002 | Bradley et al. | 333/189 |
| 6,489,863 | B2 * | 12/2002 | Taniguchi | 333/193 |
| 7,078,984 | B2 * | 7/2006 | Komuro et al. | 333/133 |
| 7,106,148 | B2 * | 9/2006 | Kawamura | 333/133 |
| 7,126,253 | B2 * | 10/2006 | Unterberger | 310/320 |
| 7,741,931 | B2 * | 6/2010 | Matsuda et al. | 333/133 |
| 2002/0153965 | A1 * | 10/2002 | Ruby et al. | 333/133 |
| 2003/0227358 | A1 | 12/2003 | Inose | |
| 2004/0100342 | A1 | 5/2004 | Nishihara et al. | |
| 2004/0113720 | A1 | 6/2004 | Komuro et al. | |
| 2004/0212452 | A1 | 10/2004 | Tsutsumi et al. | |
| 2006/0244550 | A1 | 11/2006 | Inoue et al. | |
| 2006/0267708 | A1 | 11/2006 | Matsuda et al. | |

FOREIGN PATENT DOCUMENTS

| | | | | |
|---|---|---|---|---|
| CN | 1855713 | A | | 11/2006 |
| JP | 58-137317 | A | | 8/1983 |
| JP | 7-283688 | | * | 10/1995 |
| JP | 2004-15397 | A | | 1/2004 |
| JP | 2004-193929 | A | | 7/2004 |
| JP | 2005-223808 | | * | 8/2005 |
| JP | 2005-295496 | | * | 10/2005 |
| JP | 2006-333012 | A | | 12/2006 |

OTHER PUBLICATIONS

English language machine translation of JP 2005-295496, published Oct. 20, 2005, 40 pages.*

Chinese Office Action dated Sep. 3, 2014, in a counterpart Chinese patent application No. 201210479096.5.

Chinese Office Action dated May 19, 2015, in a counterpart Chinese patent application No. 201210479096.5.

Chinese Office Action dated Nov. 3, 2015, in a counterpart Chinese patent application No. 201210479096.5.

Japanese Office Action dated Nov. 24, 2015 in a counterpart Japanese patent application No. 2011-255545.

* cited by examiner

FIG. 7

MATERIAL AND FILM THICKNESS OF STACKED FILMS

| | | P4-P6 (RxP) | S1-S4 (TxS) | S5-S8 (RxS) | P1-P3 (TxP) |
|---|---|---|---|---|---|
| PASSIVATION FILM | $SiO_2$ | 20 nm | 20 nm | 20 nm | 20 nm |
| UPPER ELECTRODE (Cr) | Cr | 25 nm | 25 nm | 30 nm | 30 nm |
| ADDITIONAL FILM | Ti | - | 40 nm | - | 155 nm |
| UPPER ELECTRODE (Ru) | Ru | 195 nm | 195 nm | 210 nm | 210 nm |
| SECOND PIEZOELECTRIC THIN FILM | AlN | 555 nm | 555 nm | - | - |
| TEMPERATURE COMPENSATION FILM | $SiO_2$ | 70 nm | 70 nm | - | - |
| FIRST PIEZOELECTRIC THIN FILM | AlN | 555 nm | 555 nm | 1220 nm | 1220 nm |
| LOWER ELECTRODE | Ru | 195 nm | 195 nm | 210 nm | 210 nm |
| | Cr | 85 nm | 85 nm | 100 nm | 100 nm |
| | | GB SIDE | | OPPOSITE SIDE TO GB | |

DUPLEXER WITH TRANSMISSION AND RECEPTION FILTERS EACH INCLUDING RESONATORS FORMED ON DIFFERENT CHIPS

CROSS-REFERENCE TO RELATED APPLICATION

This application is based upon and claims the benefit of priority of the prior Japanese Patent Application No. 2011-255545, filed on Nov. 22, 2011, the entire contents of which are incorporated herein by reference.

FIELD

A certain aspect of the present invention relates to a duplexer used in a high-frequency circuit of a wireless terminal.

BACKGROUND

A high-frequency circuit of wireless terminals such as mobile phones has a duplexer including a transmission filter and a reception filter connected to a common antenna terminal. Acoustic wave filters using surface acoustic waves (SAW: Surface Acoustic Wave), or bulk acoustic waves (BAW: Bulk Acoustic Wave) are used to transmission and reception filters, and it is determined which kind of acoustic wave filter is used based on a specification of a device. For example, both of the transmission filter and the reception filter may be a SAW filter or a BAW filter, or one may be a SAW filter and the other may be a BAW filter.

The BAW filter is formed by the combination of piezoelectric thin film resonators having a lower electrode, a piezoelectric thin film, and an upper electrode stacked on a substrate in this order. There has been known a piezoelectric thin film resonator of an FBAR (Film Bulk Acoustic Resonator) type having a space formed below a region in which a lower electrode and an upper electrode face each other and a piezoelectric thin film resonator of an SMR (Solidly Mounted Resonator) type having an acoustic reflection film instead of the space. In addition, there has been known a temperature compensated type TC-FBAR (Temperature Compensated FBAR) including a temperature compensation film that has a temperature coefficient of a resonance frequency opposite in sign to that of the piezoelectric thin film and is inserted into an FBAR. The TC-FBAR has been known to have a tradeoff relation between a temperature coefficient of frequency TCF of a filter and an effective electromechanical coupling coefficient $k^2_{eff}$.

It is preferable that the filter of the duplexer has a steep skirt characteristic at a side of a guard band between transmission and reception filters and a good temperature stability in order to suppress the interference of signals between the transmission filter and the reception filter. However, when the TCF is improved in order to improve temperature stability, the $k^2_{eff}$ decreases and the bandwidth of the filter becomes narrow due to the tradeoff relation between the TCF and the $k^2_{eff}$ described above.

SUMMARY OF THE INVENTION

According to an aspect of the present invention, there is provided a duplexer including a transmission filter and a reception filter having different passbands, wherein: each of the transmission filter and the reception filter includes series resonators and parallel resonators connected in a ladder shape, first resonators that are the series resonators or the parallel resonators so as to form a skirt characteristic at a side of a guard band between the transmission filter and the reception filter are one of a temperature compensated type piezoelectric thin film resonator that is made of layers including a piezoelectric thin film and a lower electrode and an upper electrode facing each other across the piezoelectric thin film, and includes a temperature compensation film having a temperature coefficient of an elastic constant opposite in sign to a temperature coefficient of an elastic constant of the piezoelectric thin film and sandwiched between the upper electrode and the lower electrode; and a first Love wave type surface acoustic wave resonator using Love waves, and second resonators that are the series resonators or the parallel resonators so as to form a skirt characteristic at an opposite side to the guard band are one of a temperature non-compensated type piezoelectric thin film resonator that is made of layers including a piezoelectric thin film and a lower electrode and an upper electrode facing each other across the piezoelectric thin film, and in which a temperature compensation film is not sandwiched between the upper electrode and the lower electrode; an LT type surface acoustic wave resonator using a lithium tantalate substrate; an LT/Sa type surface acoustic wave resonator using a substrate made by bonding a lithium tantalate substrate on a sapphire substrate; and a second Love wave type surface acoustic wave resonator having an effective electromechanical coupling coefficient larger than that of the first Love wave type surface acoustic wave resonator.

BRIEF DESCRIPTION OF THE DRAWINGS

FIG. 7 is a diagram illustrating specific materials and film thicknesses of stacked films used for a simulation;

DETAILED DESCRIPTION

First Embodiment

Figure 1:
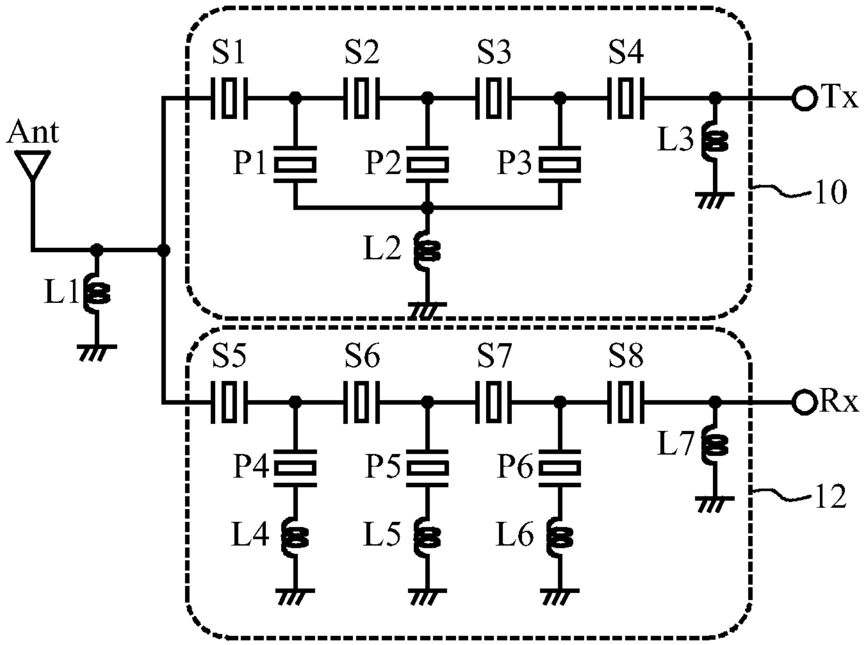
FIG. 1 is a circuit diagram of a duplexer in accordance with first and second embodiments.

FIG. 1 is a circuit diagram of a duplexer in accordance with first and second embodiments. The first embodiment is an exemplary duplexer (a transmission band is 1850 to 1910 MHz, and a reception band is 1930 to 1990 MHz) used in Band 2 of W-CDMA (Wideband Code Division Multiple Access). As illustrated in FIG. 1, a transmission filter 10 is connected between an antenna terminal Ant and a transmission terminal Tx, and a reception filter 12 is connected between the antenna terminal Ant and a reception terminal Rx. The transmission filter 10 and the reception filter 12 are a ladder-type filter including series resonators and parallel resonators connected in a ladder shape. The antenna terminal Ant is shared by the transmission filter 10 and the reception filter 12, and a matching inductor L1 is connected between the antenna terminal Ant and a ground.

The transmission filter 10 includes series resonator S1 through S4 and parallel resonators P1 through P3. The series resonator S1 through S4 are connected between the antenna terminal Ant and the transmission terminal Tx, and the parallel resonators P1 through P3 are connected between respective series resonators. One ends (opposite to ends connected to the series resonators) of the parallel resonators P1 through P3 are unified and connected to the ground via an inductor L2. A matching inductor L3 is connected between the transmission terminal Tx and the ground.

The reception filter 12 includes series resonators S5 through S8 and parallel resonators P4 through P6. The series resonators S5 through S8 are connected between the antenna terminal Ant and the reception terminal Rx, and the parallel resonators P4 through P6 are connected between respective series resonators. One ends (opposite to ends connected to series resonators) of the parallel resonators P4 through P6 are connected to the ground via respective inductors L4 through L6. A matching inductor L7 is connected between the reception terminal Rx and the ground.

Figure 2:
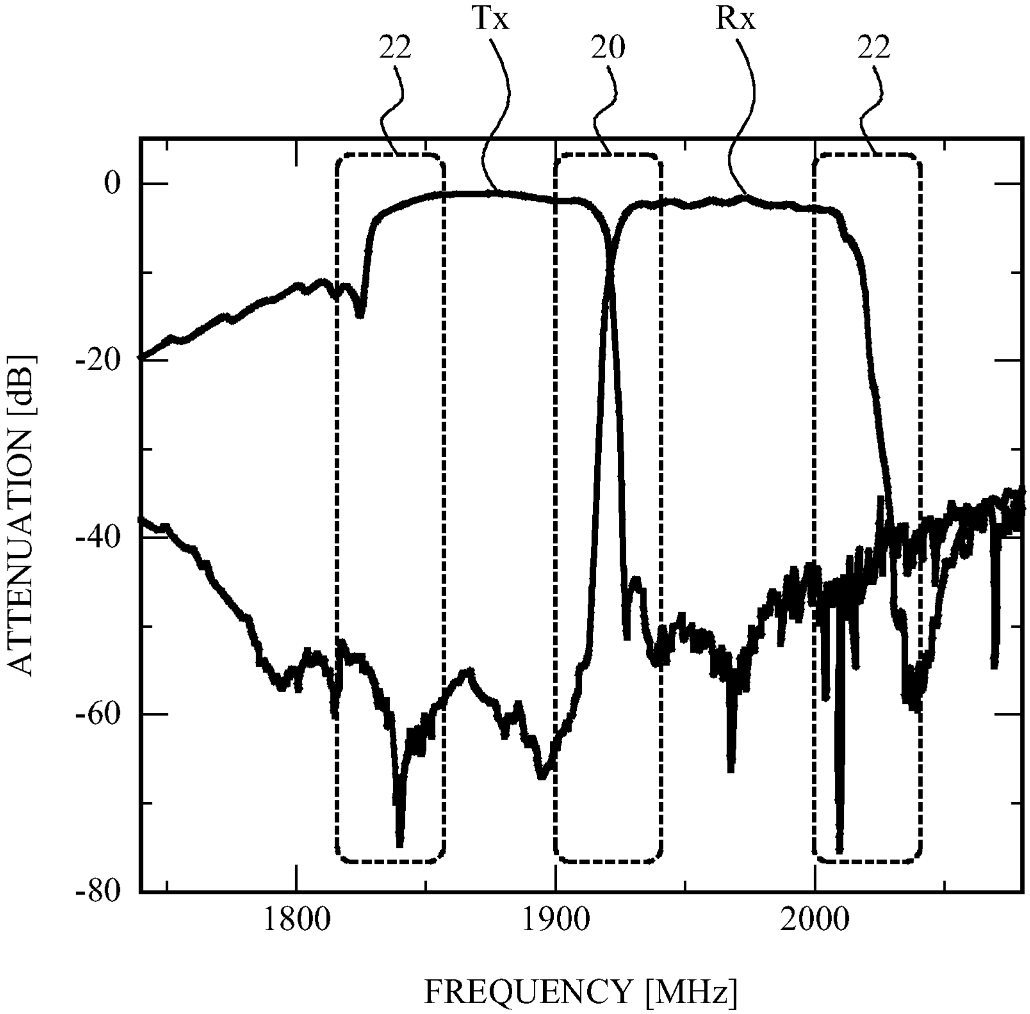
FIG. 2 is a diagram illustrating pass characteristics of the duplexer.

FIG. 2 is a diagram illustrating pass characteristics of the transmission filter 10 and the reception filter 12 included in the duplexer. A passband (Rx) of the reception filter 12 is in a high-frequency band compared to a passband (Tx) of the transmission filter 10 in the duplexer for Band 2 in accordance with the first embodiment. Thus, the series resonators S1 through S4 of the transmission filter 10 form a skirt characteristic (indicated by reference numeral 20) of the transmission filter at a side of a guard band between the transmission filter 10 and the reception filter 12 (guard band side), and the parallel resonators P4 through P6 of the reception filter 12 form a skirt characteristic (indicated by reference numeral 20) of the reception filter at the guard band side. In addition, the parallel resonators P1 through P3 of the transmission filter 10 form a skirt characteristic (indicated by reference numeral 22) of the transmission filter at an opposite side to the guard band, and the series resonators S5 through S8 of the reception filter 12 form a skirt characteristic (indicated by reference numeral 22) of the reception filter at the opposite side to the guard band.

Resonators such as piezoelectric thin film resonators or surface acoustic wave resonators may be used to the series resonators S1 through S8 and the parallel resonators P1 through P6 in FIG. 1 in accordance with the specification of the device. The first embodiment uses temperature compensated type piezoelectric thin film resonators (TC-FBAR) to the series resonators S1 through S4 and the parallel resonators P4 through P6 forming the skirt characteristics at the guard band side. In addition, the first embodiment uses temperature non-compensated type piezoelectric thin film resonators (FBAR) not including a temperature compensation film to the parallel resonators P1 through P3 and the series resonators S5 through S8 forming the skirt characteristics at the opposite side to the guard band. These two kinds of piezoelectric thin film resonators have multiple layers including a piezoelectric thin film, and a lower electrode and upper electrode that face each other across the piezoelectric thin film.

Figure 3A:
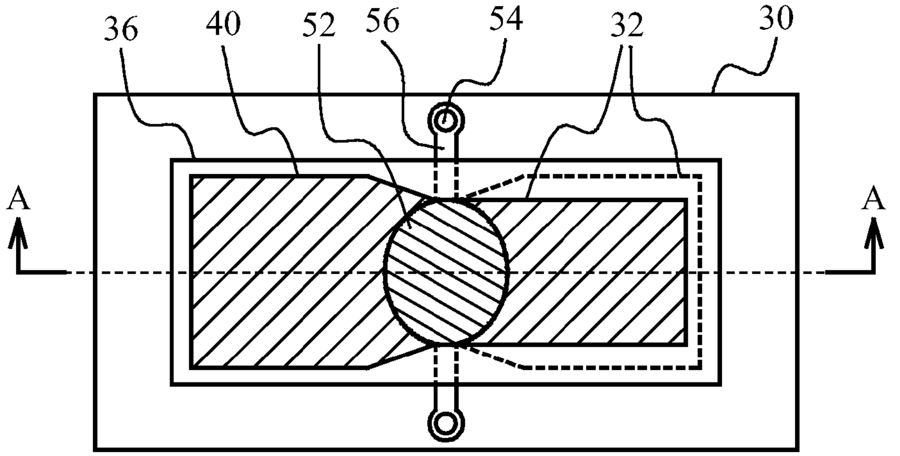
FIGS. 3A through 3C are diagrams illustrating a structure of a temperature compensated type piezoelectric thin film resonator.
Figure 3B:
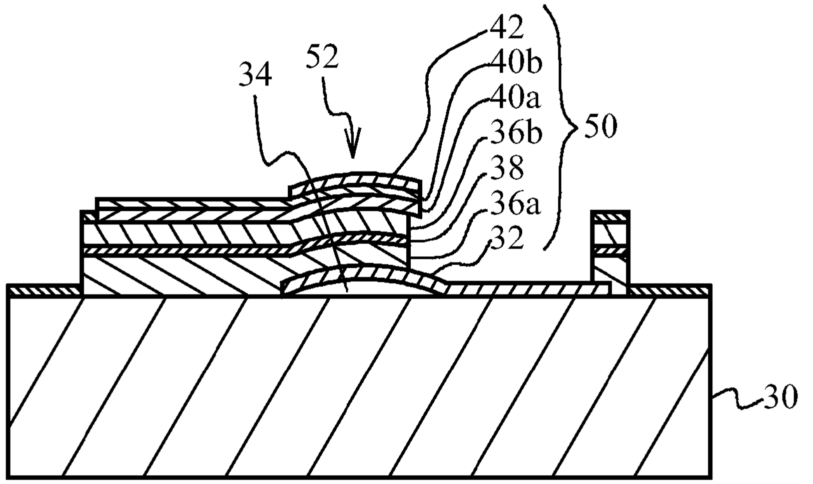
Figure 3C:
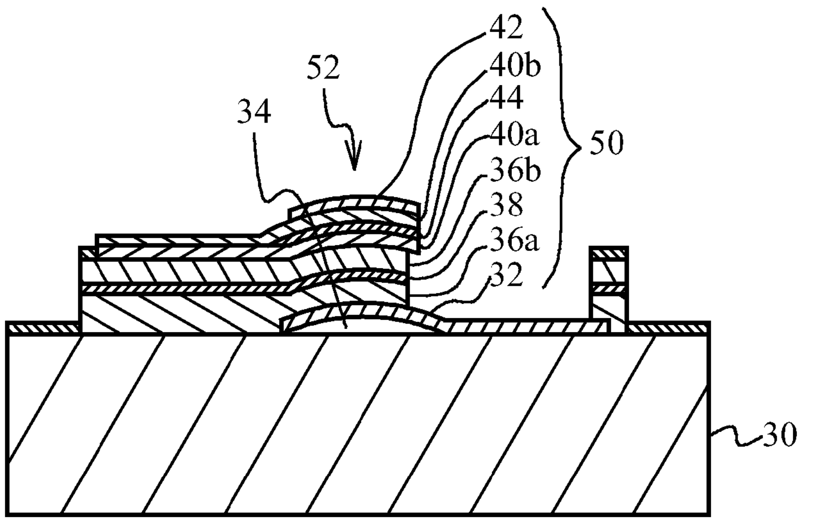

FIGS. 3A through 3C are diagrams illustrating a structure of a temperature compensated type piezoelectric thin film resonator (TC-FBAR). FIG. 3A is a plain view of the TC-FBAR viewed from an upper direction (upper electrode side), and is common to the series resonators S1 through S4 and the parallel resonators P4 through P6. FIG. 3B is a cross-sectional view of the parallel resonators P4 through P6 of the reception filter 12 taken along line A-A in FIG. 3A, and FIG. 3C is a cross-sectional view of the series resonators S1 through S4 of the transmission filter 10 taken along line A-A in FIG. 3A.

As illustrated in FIG. 3B, each of the parallel resonators P4 through P6 of the reception filter 12 includes a lower electrode 32 formed on a substrate 30, and a dome-shaped space 34 formed with a part of the lower electrode 32 convexly curved to the upper direction (the opposite side to the substrate 30). Moreover, on the substrate 30, stacked are a first piezoelectric thin film 36*a*, a temperature compensation film 38, a second piezoelectric thin film 36*b*, an upper electrode 40, and a passivation film 42 in this order so as to cover a part of at least a region, in which the space 34 is formed, of the lower electrode. The lower electrode 32 through the passivation film 42 are collectively referred to as a multilayered film 50. Thus, the upper electrode 40 and the lower electrode 32 face each other across at least a part of the piezoelectric thin films (the first piezoelectric thin film 36*a* and the second piezoelectric thin film 36*b*), and the space 34 is located below the lower electrode 32 in the region in which the upper electrode 40 and the lower electrode 32 face each other.

As illustrated in FIG. 3A, a resonance region 52 is the region in which the upper electrode 40 and the lower electrode 32 face each other across the first piezoelectric thin film 36*a* and the second piezoelectric thin film 36*b*. An etching medium introduction hole 54 is provided to a surface of the lower electrode 32 located in the vicinity of the resonance region 52. In addition, an etching medium introduction path 56 is formed between the etching medium introduction hole 54 and the space 34. In addition, a part (hatched part) of the lower electrode 32 is exposed from an aperture of a piezoelectric thin film 36. The entire part of the lower electrode 32 is indicated by a dashed line.

Silicon (Si) may be used to the substrate 30, and glass, or ceramic may be also used besides silicon. The lower electrode 32 may be an electrode film formed by stacking chrome (Cr) and ruthenium (Ru) in this order from the substrate 30 side as, for example. The upper electrode 40 may be an electrode film formed by stacking ruthenium (Ru) and chrome (Cr) in this order from the substrate 30 side (an Ru layer is indicated by reference numeral 40*a*, and a Cr layer is indicated by reference numeral 40*b*), for example. The lower electrode 32 and the upper electrode 40 may be made by the combination of metal layers such as aluminum (Al), copper (Cu), molybdenum (Mo), tungsten (W), tantalum (Ta), platinum (Pt), rhodium (Rh) and iridium (Ir) in addition to the above ones. Moreover, the electrode film may have a single layer structure instead of a two-layer structure.

The first piezoelectric thin film 36*a* and the second piezoelectric thin film 36*b* may be a piezoelectric thin film having a high Q-value stably formed by using aluminum nitride (AlN) film for example. The piezoelectric thin film may be made of a piezoelectric material such as zinc oxide (ZnO), lead zirconate titanate (PZT), or lead titanate ($PbTiO_3$) besides aluminum nitride. Moreover, it is possible to increase a piezoelectric constant by adding a ternary element such as scandium (Sc) for example to the piezoelectric thin film including the above described piezoelectric material as a main component in order to increase an effective electromechanical coupling coefficient $k^2_{eff}$ described later. Here, the ternary element may be included in a piezoelectric material such as aluminum nitride that is a main component of the piezoelectric thin film to the extent that the piezoelectric material functions as the piezoelectric thin film of the piezoelectric film resonator. For example, when the ternary element (described with M) is added to the piezoelectric thin film in order to increase the Q-value as described above, it is possible to make x smaller than 0.5 in $M_xAl_{1-x}N$.

The temperature compensation film 38 has a temperature coefficient of an elastic constant opposite in sign to those of the piezoelectric thin films (36*a*, 36*b*), and is made of silicon dioxide ($SiO_2$). The temperature compensation film 38 may be mainly made of silicon oxide or silicon nitride. That is to say, it is possible to add the ternary element that increases a temperature coefficient of a resonance frequency of the temperature compensation film 38 to the extent that the temperature compensation film 38 has a temperature compensation effect in the piezoelectric thin film resonator. Although the temperature compensation film 38 can be located further out than the lower electrode 32 and the upper electrode 40, it is preferably located between the lower electrode 32 and the upper electrode 40 because the thickness of the temperature compensation film 38 can be reduced.

Silicon dioxide ($SiO_2$) may be used to the passivation film 42 for example, but other insulative materials such as aluminum nitride (AlN) may be used besides silicon dioxide.

The above-described multilayered film 50 can be formed by forming a film by sputtering for example, and then patterning the film into a desired shape by photolithographic and etching. The multilayered film 50 can be also patterned by liftoff. Then, etched are outer peripheries of the first piezoelectric thin film 36*a*, the temperature compensation film 38, and the second piezoelectric thin film 36*b* by wet etching using the upper electrode 40 as a mask for example.

After the above-described multilayered film 50 is formed, a sacrifice layer (not illustrated) is removed to form the dome-shaped space 34 located below the lower electrode 32. The sacrifice layer is preliminarily provided before the lower electrode 32 is formed. The sacrifice layer can be made of a material such as MgO, ZnO, Ge, and $SiO_2$ that is easily dissolved by etching liquid or etching gas, and be formed by sputtering or evaporation, for example. The sacrifice layer is preliminarily formed into a desired shape (the shape of the space 34) by photolithographic and etching. After the multilayered film 50 is formed, the sacrifice layer is removed by introducing the etching medium beneath the lower electrode 32 through the etching medium introduction hole 54 and the etching medium introduction path 56 formed in the lower electrode 32. The space 34 may be formed so as to pierce through the substrate 30, or may be formed so that the lower surface of the lower electrode 32 may be exposed to the outside through the space 34.

The structure of the series resonators S1 through S4 of the transmission filter 10 is almost the same as that of the parallel resonators P4 through P6 in FIG. 3B except that an additional film 44 is formed between the Ru layer 40*a* and the Cr layer 40*b* in the upper electrode 40 in order to adjust a resonance frequency as illustrated in FIG. 3C. Resonance frequencies of the series resonators S1 through S4 are shifted to a low frequency side compared to the parallel resonators P4 through P6 because of the additional film 44. The additional film 44 may be made of titanium (Ti), but may be also made of aluminum (Al), copper (Cu), chrome (Cr), molybdenum (Mo), tungsten (W), tantalum (Ta), platinum (Pt), ruthenium (Ru), rhodium (Rh), iridium (Ir), or silicon dioxide ($SiO_2$) besides titanium.

Figure 4A:
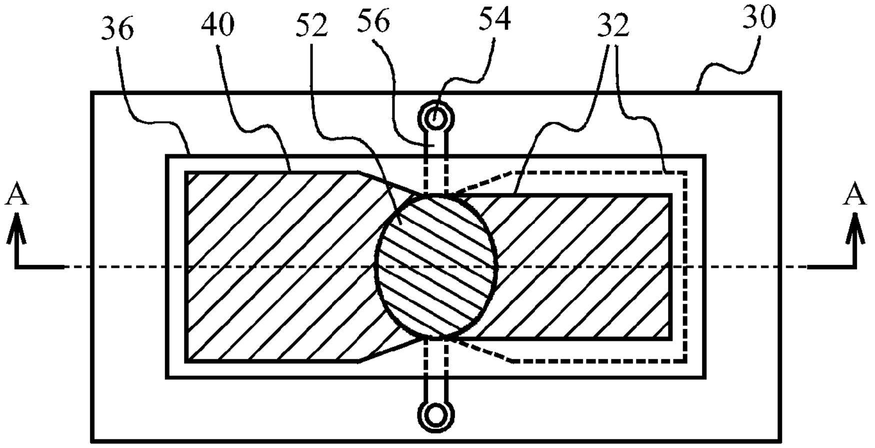
FIGS. 4A through 4C are diagrams illustrating a structure of a piezoelectric thin film resonator not including a temperature compensation film.
Figure 4B:
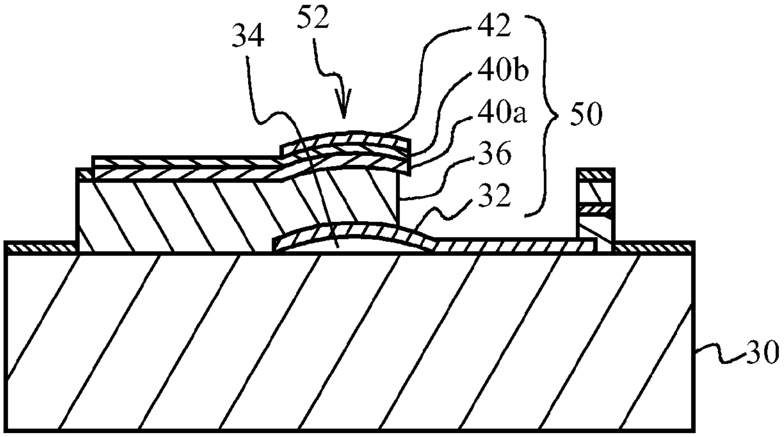
Figure 4C:
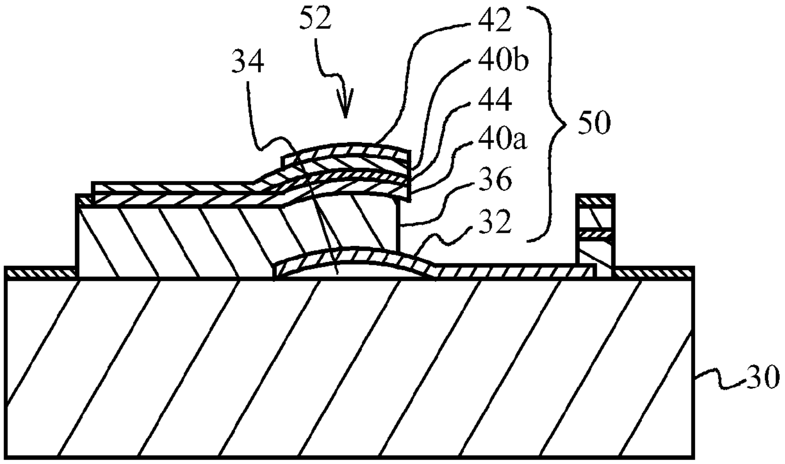

FIGS. 4A through 4C are diagrams illustrating a structure of a temperature non-compensated type piezoelectric thin film resonator (FBAR) not including a temperature compensation film. Same reference numerals are affixed to the elements common to FIG. 3, and a detail description will be omitted. FIG. 4A is a plain view of the FBAR viewed from the upper direction, and is common to the parallel resonators P1 through P3 and the series resonators S5 through S8. FIG. 4B is a cross-sectional view of the series resonators S5 through S8 of the reception filter 12 taken along line A-A in FIG. 4A, and FIG. 4C is a cross-sectional view of the parallel resonators P1 through P3 of the transmission filter 10 taken along line A-A in FIG. 4A.

The series resonators S5 through S8 of the reception filter 12 have the same structure as the parallel resonators P4 through P6 of the reception filter 12 illustrated in FIG. 3B except that the temperature compensation film 38 is not included as illustrated in FIG. 4B. In addition, the parallel resonators P1 through P3 of the transmission filter 10 have the same structure as the series resonators S1 through S4 of the transmission filter 10 illustrated in FIG. 3C except that the temperature compensation film 38 is not included, as illustrated in FIG. 4C. Unlike the TC-FBAR, the above-described temperature non-compensated type FBAR does not include the temperature compensation film 38, and the piezoelectric thin film 36 is not divided into two.

Figure 5:
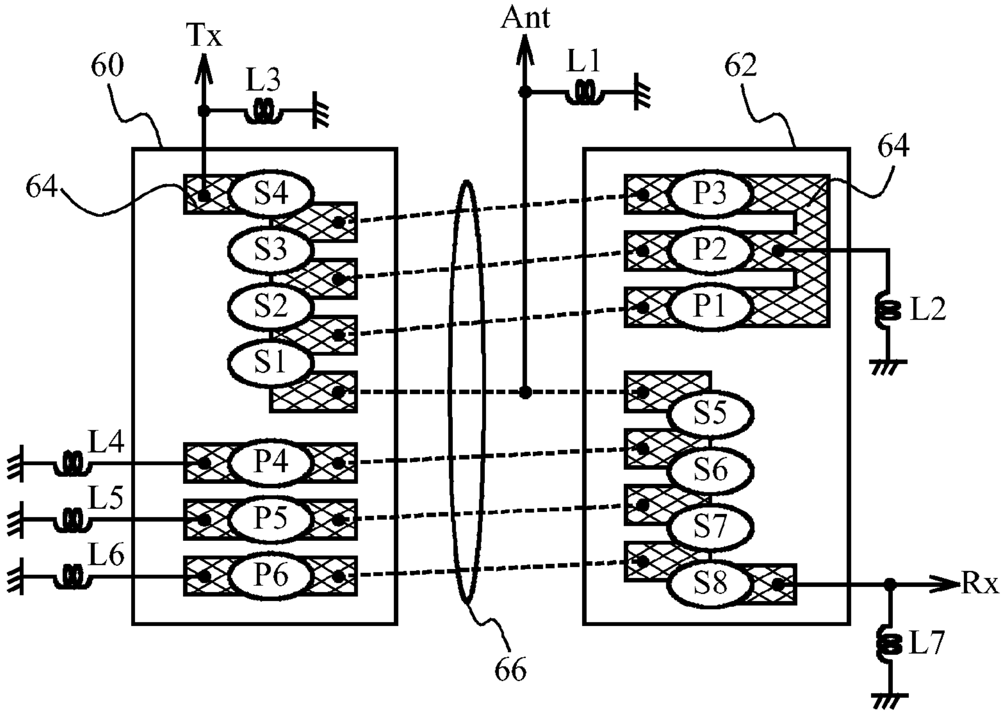
FIG. 5 is a schematic plane view illustrating a layout of the duplexer in accordance with the first embodiment.

FIG. 5 is a schematic plain view illustrating a layout of the duplexer in accordance with the first embodiment. The series resonator S1 through S8, the parallel resonators P1 through P6, and the inductors L1 through L7 correspond to respective circuit elements illustrated in FIG. 1. A region 64 cross-hatched in the drawing denotes wiring patterns connected to the above-described resonators and inductors. The series resonators S1 through S4 and parallel resonators P4 through P6 of the TC-FBAR type are formed in a single first chip 60. The parallel resonators P1 through P3 and series resonators S5 through S8 of the temperature non-compensated type FBAR type are formed in a single second chip 62. In addition, a region 66 means that the resonators on the first chip 60 are connected with the resonators on the second chip 62 provided separately from the first chip 60 via the wirings formed on the surface of the mounting substrate to which the chips are mounted as described hereinafter.

Figure 6:
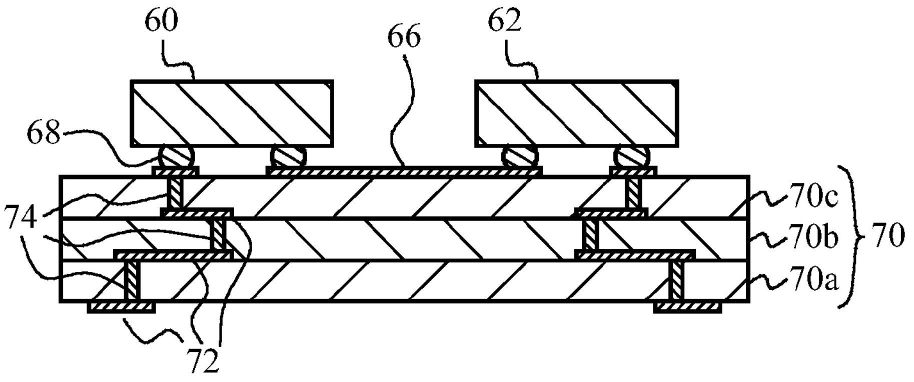
FIG. 6 is a schematic cross-sectional view illustrating a structure of the duplexer in accordance with the first embodiment.

FIG. 6 is a schematic cross-sectional view illustrating a structure of the duplexer in accordance with the first embodiment. A mounting substrate 70 is a multilayered substrate made by stacking multiple substrates (70*a* through 70*c*), and the first chip 60 and the second chip 62 are flip-chip mounted on a surface of the mounting substrate 70 via bumps 68. A wiring pattern 72 is formed on a principal surface of each layer of the mounting substrate 70, and the wiring patterns 72 in different layers are connected each other through vias 74 formed in the mounting substrate 70. The first chip 60 and the second chip 62 are electrically connected each other through a wiring pattern (indicated by reference numeral 66) formed on a die attach layer (70*c*) of the surface of the mounting substrate 70. In more detail, the series resonators S1 through S4 and the parallel resonators P1 through P3 included in the transmission filter 10 are electrically connected each other via wirings formed on a die attach layer 70*c*, and the series resonators S5 through S8 and the parallel resonators P4 through P6 included in the reception filter 12 are electrically connected each other via the wirings formed on the die attach layer 70*c*. Thus, it is possible to reduce the inductance component of the wiring and suppress the effect on filter characteristics as compared to interconnecting the first chip 60 and the second chip 62 via a wiring pattern in the mounting substrate 70.

Here, it is preferable that the filter has a steep skirt characteristic at the guard band side and has a good temperature stability in the duplexer with a narrow guard band as illustrated in FIG. 2. The steep skirt characteristic can be achieved by making the effective electromechanical coupling coefficient $k^2_{eff}$ small, and the temperature stability can be improved by making a temperature coefficient of frequency TCF small. Therefore, it is preferable to make small the effective electromechanical coupling coefficient $k^2_{eff}$ and the temperature coefficient of frequency TCF of the series resonators S1 through S4 and the parallel resonators P4 through P6 (formed in the first chip 60) forming the skirt characteristics at the guard band side.

On the other hand, although the steepness and the temperature stability are not demanded so much in the skirt characteristics at the opposite side to the guard band compared to those in the skirt characteristics at the guard band side, it is preferable to set the skirt characteristics at the opposite side to the guard band so that a passband of the filter becomes as wide as possible. The widening of the bandwidth can be achieved by making the $k^2_{eff}$ large, but is in a tradeoff relation with the steepness of the skirt characteristic. Therefore, it is preferable that the $k^2_{eff}$ is made to be large in the parallel resonators P1 through P3 and the series resonators S5 through S8 (formed in the second chip 62) forming the skirt characteristics at the opposite side to the guard band.

A description will now be given of a simulation result comparing filter characteristics of the duplexer in accordance with the first embodiment with that of a duplexer in accordance with a comparative example.

FIG. 7 is a diagram indicating specific materials and film thicknesses of stacked films included in the multilayered film 50 used for the simulation. The parallel resonators P4 through P6 of the reception filter 12 (RxP, FIG. 3B) are configured as follows: the lower electrode 32 has a two-layer structure made of Cr with a film thickness of 85 nm and Ru with a film thickness of 195 nm (Cr is located at the substrate 30 side), the first piezoelectric thin film 36*a* is made of AN with a film thickness of 555 nm, the temperature compensation film 38 is made of $SiO_2$ with a film thickness of 70 nm, the second piezoelectric thin film 36*b* is made of AlN with a film thickness of 555 nm, the upper electrode has a two-layer structure made of Ru (40*a*) with a film thickness of 195 nm and Cr (40*b*) with a film thickness of 25 nm, and the passivation film 42 is made of $SiO_2$ with a film thickness of 20 nm. The series resonators S1 through S4 of the transmission filter 10 (TxS, FIG. 3C) are configured so that the additional film 44 formed between the Ru layer 40*a* and the Cr layer 40*b* of the upper electrode is made of Ti with a film thickness of 40 nm. Other configurations of the series resonators S1 through S4 are the same as those of the parallel resonators P4 through P6.

The series resonators S5 through S8 of the reception filter 12 (RxS, FIG. 4B) are configured as follows: the lower electrode 32 has a two-layer structure made of Cr with a film thickness of 100 nm and Ru with a film thickness of 210 nm (Cr is located at the substrate 30 side), the piezoelectric thin film 36 is made of AlN with a film thickness of 1220 nm, the upper electrode has a two-layer structure made of Ru (40*a*) with a film thickness of 210 nm and Cr (40*b*) with a film thickness of 30 nm, and the passivation film 42 is made of $SiO_2$ with a film thickness of 20 nm. The parallel resonators P1 through P3 of the transmission filter 10 (TxP, FIG. 4C) are configured so that the additional film 44 formed between the Ru layer 40*a* and the Cr layer 40*b* of the upper electrode is made of Ti with a film thickness of 155 nm. Other configurations of the parallel resonators P1 through P3 are the same as those of the series resonators S5 through S8.

As apparent from FIG. 5, all the materials and film thicknesses of the stacked films of the parallel resonators P4 through P6 are the same as those of the series resonators S1 through S4 except the additional film 44, the parallel resonators P4 through P6 and the series resonators S1 through S4 forming the skirt characteristic at the guard band (GB) side. All the materials and film thicknesses of the stacked films of the series resonators S5 through S8 are the same as those of the parallel resonators P1 through P3 except the additional film 44, the series resonators S5 through S8 and the parallel resonators P1 through P3 forming the skirt characteristic at the opposite side to the guard band (GB) side. In addition, a frequency shift amount caused by the formation of the additional film 44 in the parallel resonators P1 through P3 is larger than a frequency shift amount caused by the formation of the additional film 44 in the series resonators S1 through S4. Therefore, the film thickness of the additional film 44 in P1 through P3 (155 nm) is larger than that in S1 through S4 (40 nm).

All the resonators of the duplexer of the first embodiment are made to be the TC-FBAR type piezoelectric film resonator in which the temperature compensation film is inserted into a center area of the piezoelectric thin film. The specific structure is the same as the one illustrated in FIGS. 3A through 3C.

In the first embodiment, the $k^2_{eff}$ is made to be approximately 4.5%, and the TCF is made to be approximately 0 ppm/° C. in the series resonators S1 through S4 and the parallel resonators P4 through P6 forming the skirt characteristics at the guard band side. In addition, the $k^2_{eff}$ is made to be approximately 7%, and the TCF is made to be approximately −30 ppm/° C. in the parallel resonators P1 through P3 and the series resonators S5 through S8 forming the skirt characteristics at the opposite side to the guard band. On the other hand, the comparative example uses TC-FBAR type resonators to the resonators forming the skirt characteristics at the guard band side and its opposite side, and the $k^2_{eff}$ of the resonators forming the skirt characteristics is approximately 4.5%.

Figure 8A:
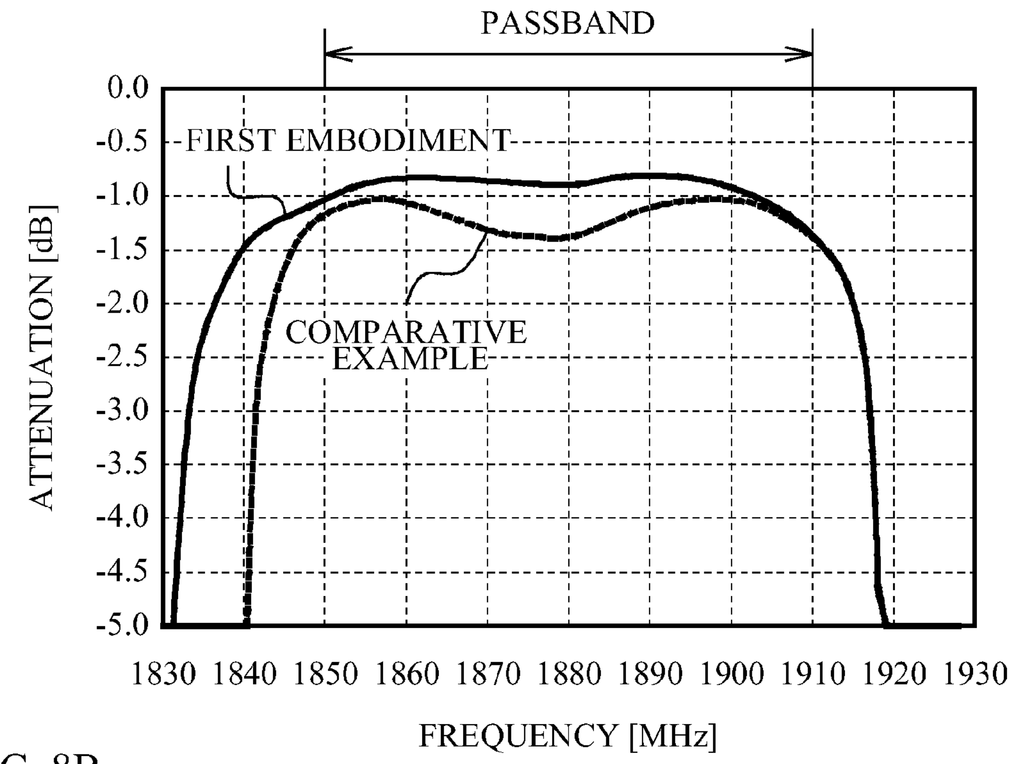
FIGS. 8A and 8B are graphs depicting filter characteristics of the duplexer in accordance with the first embodiment.
Figure 8B:
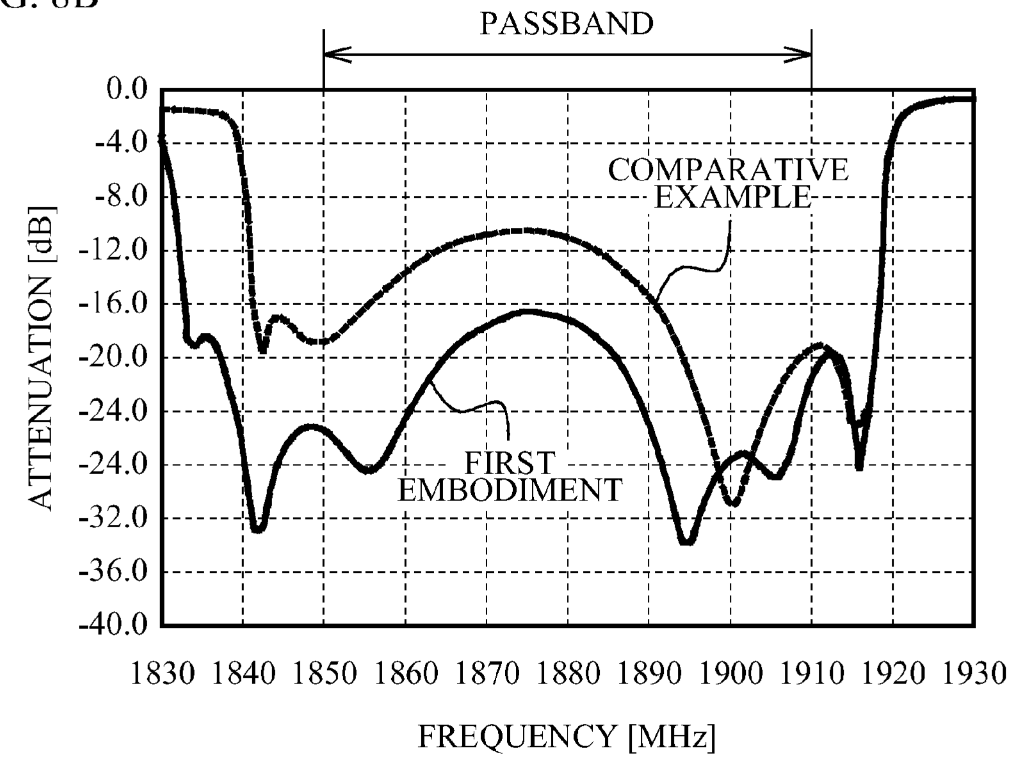

FIGS. 8A and 8B are graphs depicting the filter characteristics of the duplexer in accordance with the first embodiment in comparison with the comparative example. FIG. 8A depicts pass characteristics in a band of the transmission filter 10, and FIG. 8B depicts return loss characteristics in a band of the transmission terminal Tx. As approximately 4.5% is the $k^2_{eff}$ of the resonators forming the skirt characteristics at the guard band side in both of the first embodiment and the comparative example, there is no big difference in the skirt characteristics. On the other hand, 4.5% is the $k^2_{eff}$ of the resonators forming the skirt characteristics at the opposite side to the guard band in the comparative example, but is 7% in the first embodiment. Thus, the first embodiment improves the matching compared to the comparative example, and widens the bandwidth of the filter.

As described above, the first embodiment uses temperature compensated type piezoelectric thin film resonators (TC-TBAR) to the resonators S1 through S4 and P4 through P6 (hereinafter, referred to as "first resonators") forming the skirt characteristics at the side of the guard band between the transmission filter 10 and the reception filter 12. In addition, the first embodiment uses temperature non-compensated type piezoelectric thin film resonators (FBAR) not including the temperature compensation film 38 to the resonators P1 through P3 and S5 through S8 (hereinafter, referred to as "second resonators") forming the skirt characteristics at the opposite side to the guard band. As described above, resonators having a small $k^2_{eff}$ and a small TCF are used to the first resonators, and resonators having a $k^2_{eff}$ and a TCF larger than those of the first resonators are used to the second resonators in the duplexer of the first embodiment. Thus, it is possible to achieve the steep skirt characteristic at the guard band side, improve temperature stability, and widen the bandwidth of the filter.

Second Embodiment

A second embodiment uses a resonator other than an FBAR to the second resonators.

Figure 9:
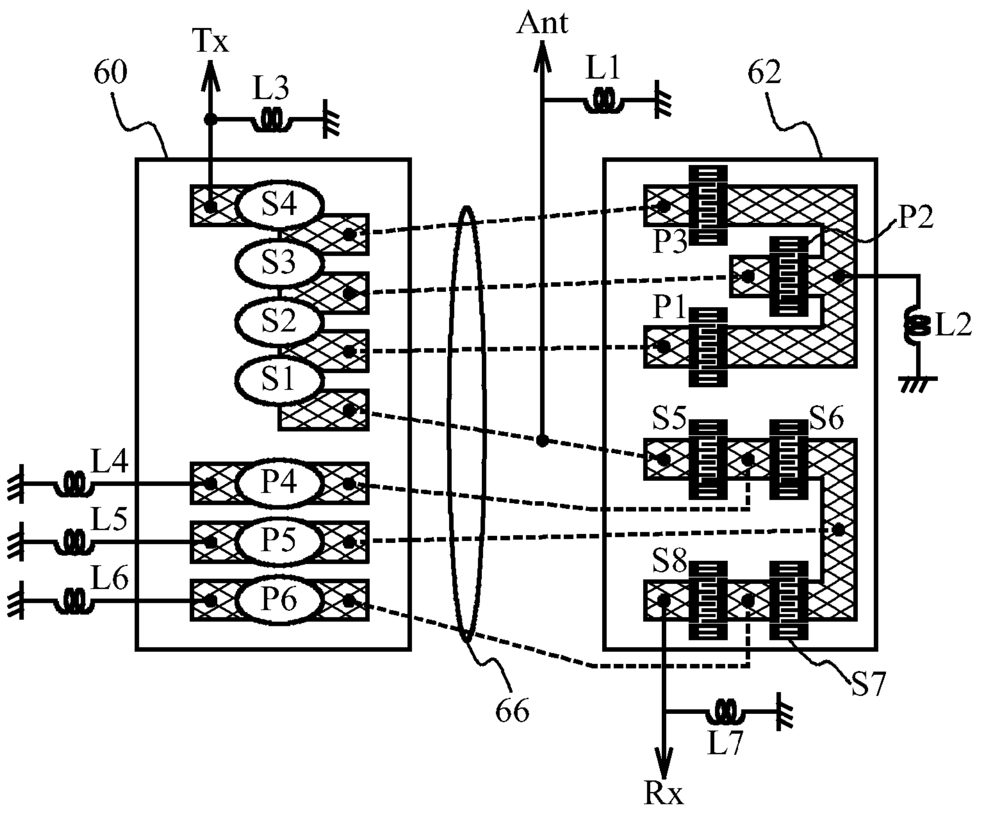
FIG. 9 is a plain view illustrating a layout of a duplexer in accordance with the second embodiment.

FIG. 9 is a plain view illustrating a layout of a duplexer in accordance with the second embodiment. Compared to the first embodiment (FIG. 5), surface acoustic wave (SAW) resonators are used to the parallel resonators P1 through P3 and the series resonators S5 through S8 forming the skirt characteristics at the opposite side to the guard band. Other structures are the same as those of the first embodiment, and a detail description is omitted.

Figure 10A:
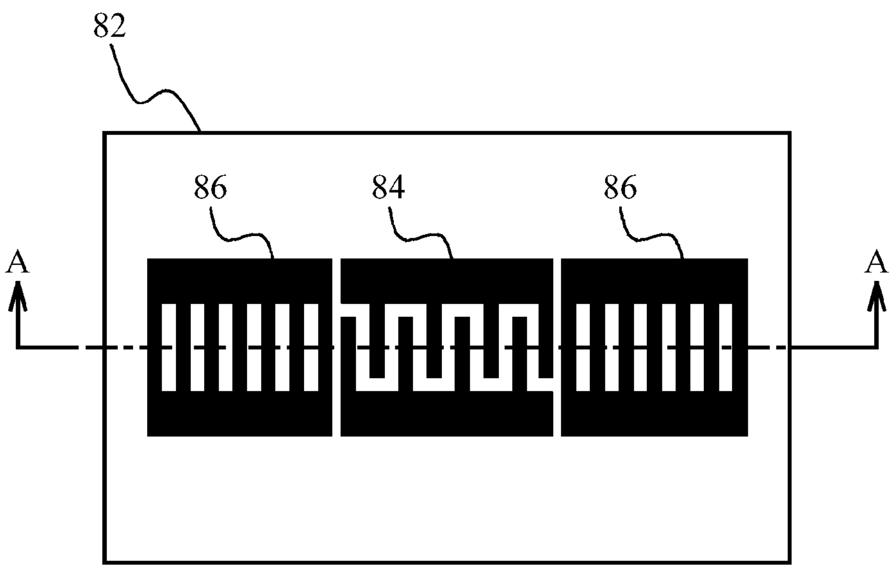
FIGS. 10A and 10B are diagrams illustrating a structure of a surface acoustic wave resonator using an LT/Sa substrate.
Figure 10B:
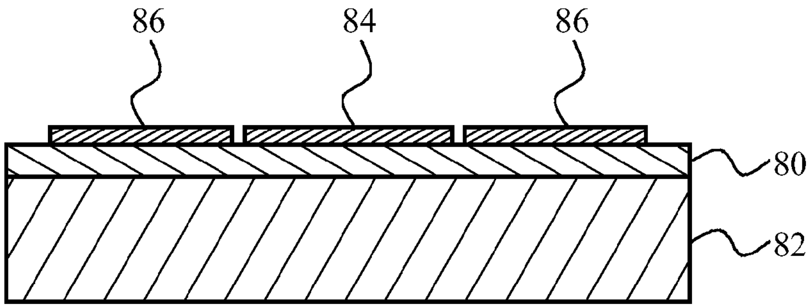
Figure 11A:
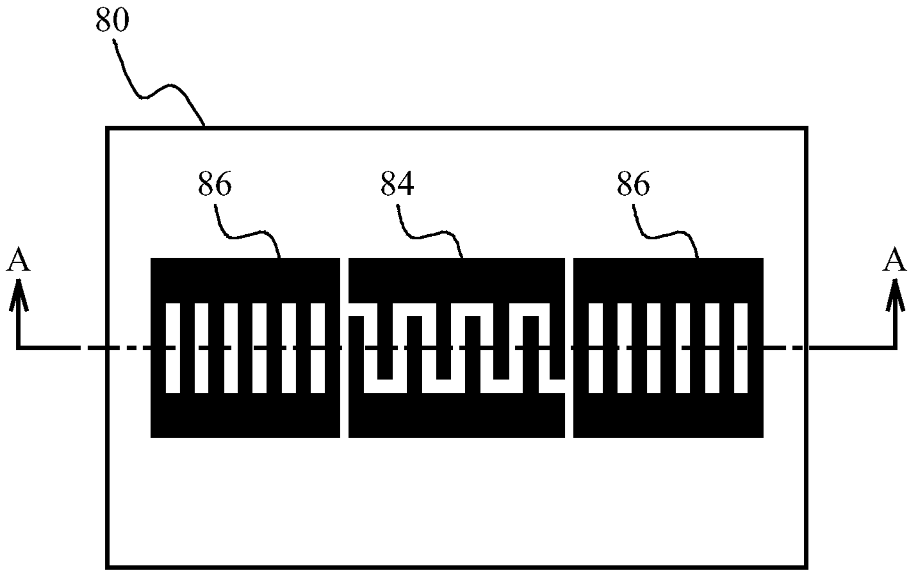
FIGS. 11A and 11B are diagrams illustrating a structure of a surface acoustic wave resonator using an LT substrate.
Figure 11B:
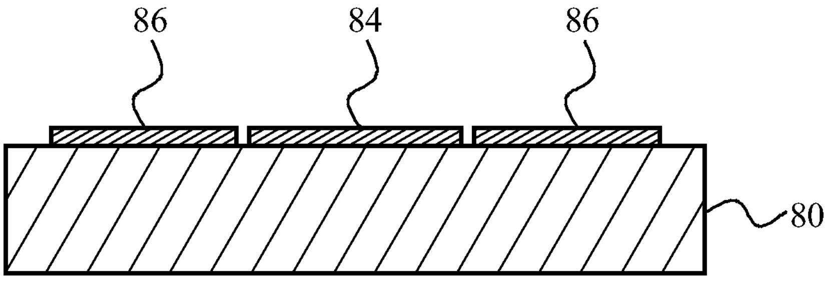
Figure 12A:
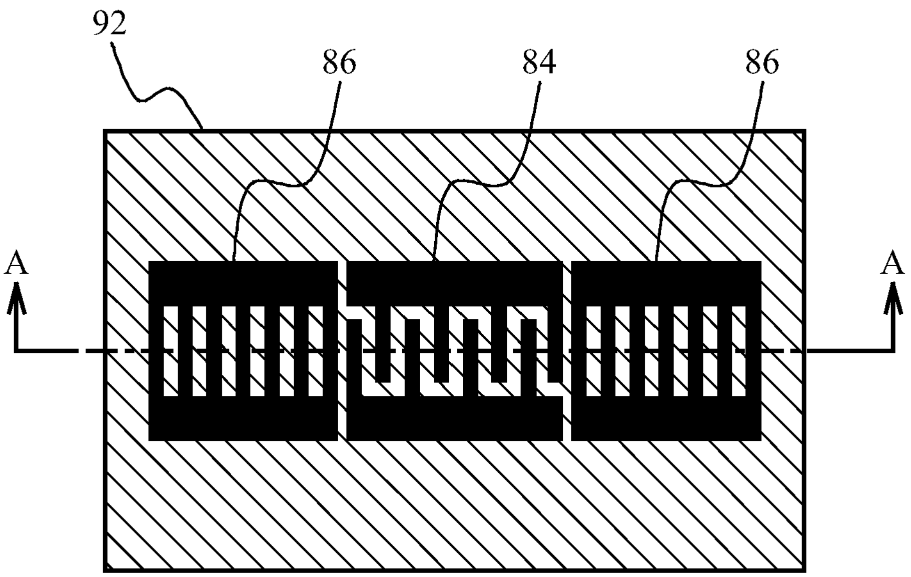
FIGS. 12A and 12B are diagrams illustrating a structure of a surface acoustic wave resonator using Love waves.
Figure 12B:
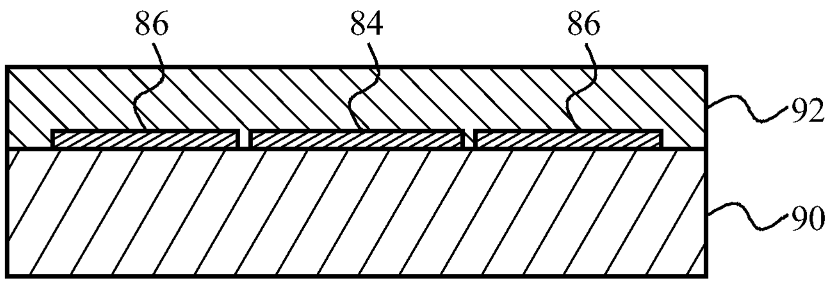

FIG. 10A through FIG. 12B are diagrams illustrating structures of various types of SAW resonators. FIG. 10A, FIG. 11A and FIG. 12A are schematic plain views, and FIG. 10B, FIG. 11B and FIG. 12B are schematic cross-sectional views taken along line A-A in the above schematic plane views. A surface acoustic wave resonator illustrated in FIGS. 10A and 10B is formed by forming a comb-shaped electrode 84 and reflection electrodes 86 on a substrate made by bonding a 42° Y-cut X-propagation lithium tantalate ($LiTaO_3$) substrate 80 on a sapphire substrate 82, and is referred to as an "LT/Sa type surface acoustic wave resonator" hereinafter. The lithium tantalate substrate 80 may have a thickness of 20 μm, and the sapphire substrate 82 may have a thickness of 230 μm for example. In addition, it is possible to use metals mainly made of Al, to which Cu is added, to electrode materials of the comb-shaped electrode 84 and the reflection electrodes 86. The above described LT type surface acoustic wave resonator has a $k^2_{eff}$ of approximately 8% and a TCF of approximately −20 ppm/° C.

A surface acoustic wave resonator illustrated in FIGS. 11A and 11B has the same structure as FIGS. 10A and 10B except that it does not use the sapphire substrate but uses the 42° Y-cut X-propagation lithium tantalate ($LiTaO_3$) substrate 80 as a substrate, and is referred to as an "LT type surface acoustic wave resonator" hereinafter. The above described LT type surface acoustic wave resonator may have a $k^2_{eff}$ of approximately 8% and a TCF of approximately −40 ppm/° C.

A surface acoustic wave resonator illustrated in FIGS. 12A and 12B is a surface acoustic wave resonator using a 0° Y-cut X-propagation lithium niobate ($LiNbO_3$) substrate 90 as a substrate and using Love waves, and is referred to as a "Love wave type surface acoustic wave resonator" hereinafter. The comb-shaped electrode 84 and the reflection electrodes 86 are formed on the lithium niobate substrate 90 in the same manner as FIG. 10A through FIG. 11B, and a silicon oxide film 92 covers an entire upper surface of the substrate including these electrodes. It is possible to use a metal mainly made of Cu for example as an electrode material of the comb-shaped electrode 84 and the reflection electrodes 86. The above described Love wave type surface acoustic wave resonator may have a $k^2_{eff}$ of approximately 11% and a TCF of approximately 0 ppm/° C.

A description will now be given of a simulation result comparing filter characteristics of the duplexer of the second embodiment with that of the duplexer of the comparative example. The second embodiment is assumed to use TC-FBAR type resonators to the series resonators S1 through S4 and the parallel resonators P4 through P6 forming the skirt characteristics at the guard band side as with the first embodiment, and the $k^2_{eff}$ is made to be approximately 4.5%, and the TCF is made to be approximately 0 ppm/° C. In addition, it is assumed that LT/Sa type surface acoustic wave resonators are used to the parallel resonators P1 through P3 and the series resonators S5 through S8 forming the skirt characteristics at the opposite side to the guard band, the $k^2_{eff}$ is made to be approximately 8%, and the TCF is made to be approximately −20 ppm/° C. in the second embodiment. On the other hand, the comparative example is assumed to use TC-FBAR type resonators to both of the resonators forming the skirt characteristics at the guard band side and its opposite side, and the $k^2_{eff}$ of the resonators forming the skirt characteristics is made to be approximately 4.5%.

Figure 13A:
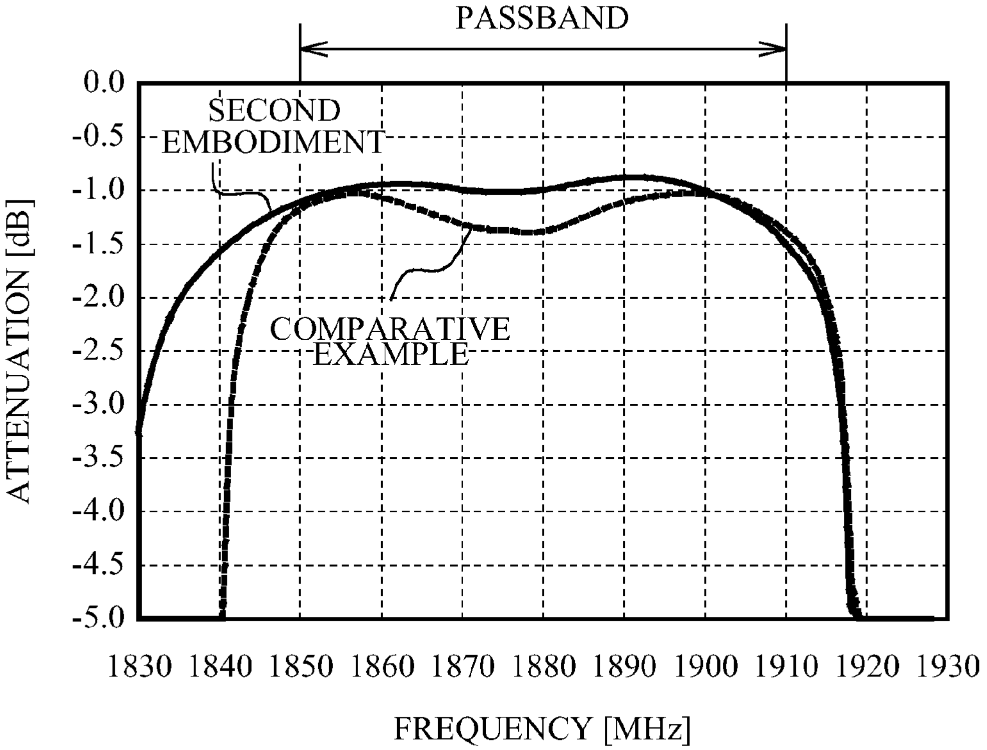
FIGS. 13A and 13B are graphs depicting filter characteristics of the duplexer in accordance with the second embodiment.
Figure 13B:
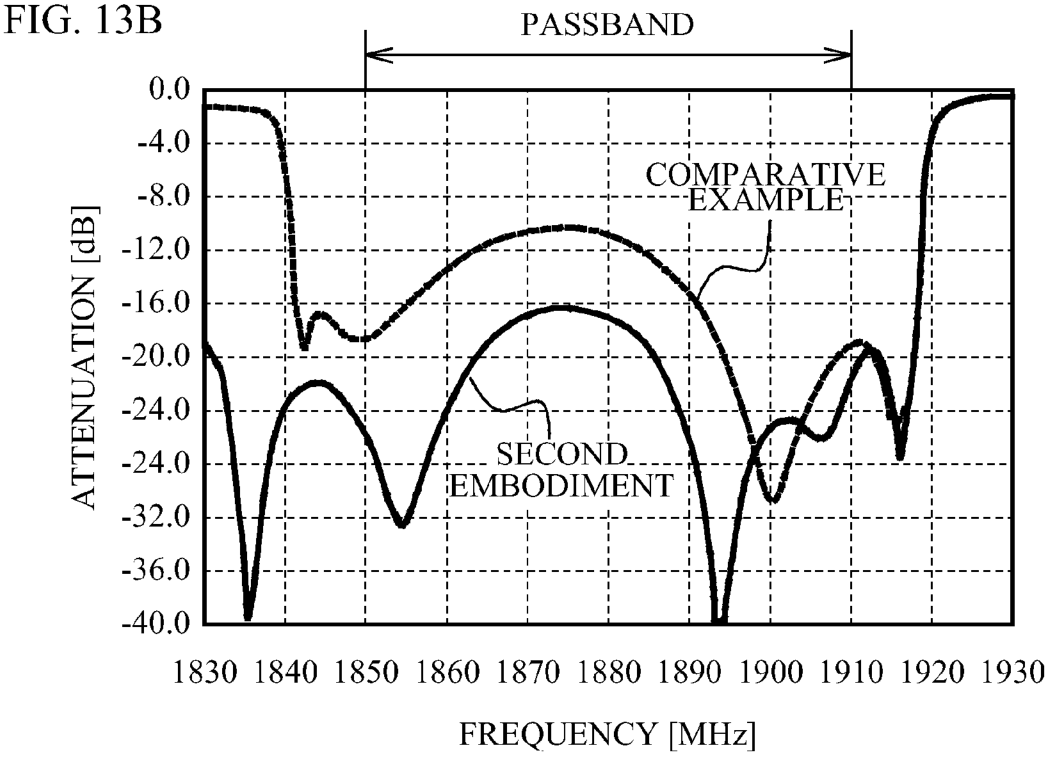

FIGS. 13A and 13B are graphs depicting filter characteristics of the duplexers of the second embodiment and the comparative example. FIG. 13A depicts pass characteristics in the band of the transmission filter 10, and FIG. 13B depicts return loss characteristics in the band of the transmission terminal Tx. The $k^2_{eff}$ of the resonators forming the skirt characteristics at the guard band side is approximately 4.5% in the second embodiment and the comparative example, and there is no big difference in the skirt characteristics. On the other hand, 4.5% is the $k^2_{eff}$ of the resonators forming the skirt characteristics at the opposite side to the guard band in the comparative example, but is 8% in the second embodiment. Therefore, the second embodiment improves the matching compared to the comparative example, and widens the bandwidth of the filter.

As described above, the duplexer of the second embodiment uses temperature compensated type piezoelectric thin film resonators (TC-TBAR) to the first resonators (S1 through S4 and P4 through P6) forming the skirt characteristics at the side of the guard band between the transmission filter 10 and the reception filter 12. In addition, the second resonators (P1 through P3 and S5 through S8) forming the skirt characteristics at the opposite side to the guard band are LT type surface acoustic wave resonators using a lithium tantalate substrate, LT/Sa type surface acoustic wave resonators using a substrate made by bonding a lithium tantalate substrate on a sapphire substrate, or Love wave type surface acoustic wave resonators using Love waves. As described above, the duplexer of the second embodiment uses a resonator having a small $k^2_{eff}$ and TCF to the first resonators, and uses a resonator having a $k^2_{eff}$ and TCF larger than those of the first resonators to the second resonators, as with the first embodiment. Thus, it is possible to achieve the steep skirt characteristics at the guard band side, improve temperature stability, and widen the bandwidth of the filter.

In the above embodiment, the LT/Sa type surface acoustic wave resonator using a bonded substrate has a TCF smaller than and a temperature stability better than the LT type surface acoustic wave resonator using only the lithium tantalate substrate. In addition, the Love wave type surface acoustic wave resonator using Love waves has a large $k^2_{eff}$ and an advantage in bandwidth widening, and has a small TCF and a good temperature stability.

Although the first and second embodiments use the temperature compensated type piezoelectric thin film resonator to the first resonators forming the skirt characteristics at the guard band side, it is possible to use the Love wave type surface acoustic wave resonator illustrated in FIG. 12 instead of the temperature compensated type piezoelectric thin film resonator. When the Love wave type surface acoustic wave resonator is also used to the second resonators forming the skirt characteristics at the opposite side to the guard band, the effective electromechanical coupling coefficient $k^2_{eff}$ of the second resonators is made to be larger than that of the first resonators. At this time, the first resonators having a small $k^2_{eff}$ are referred to as first Love wave type surface acoustic wave resonators, and the second resonators having a large $k^2_{eff}$ are referred to as second Love wave type surface acoustic wave resonators. It is possible to use the first Love wave type surface acoustic wave resonators forming the skirt characteristics at the guard band side in combination with either of the second resonators described in the first and second embodiments.

Although the first resonators have an effective electromechanical coupling coefficient $k^2_{eff}$ smaller than the $k^2_{eff}$ of the second resonators, and have a temperature coefficient of frequency TCF smaller than the TCF of the second resonators in the first and second embodiments, it is not necessary to establish the above relation in all the resonators. For example, it is sufficient if the $k^2_{eff}$ of at least one of the first resonators is smaller than the $k^2_{eff}$ of at least one of the second resonators in at least one of the transmission filter and the reception filter. In addition, it is sufficient if the TCF of the filter at the guard band side is smaller than the TCF of the filter at the opposite side to the guard band in at least one of the transmission filter and the reception filter.

Although all the first resonators (S1 through S4 and P4 through P6) are formed on the first chip 60, and all the second resonators (P1 through P3 and S5 through S8) are formed on the second chip 62 provided separately from the first chip 60 in the first and second embodiments, the resonators may take structures other than the above described structure. For example, S5 through S8 out of the second resonators may be formed on a single chip, and P1 through P3 may be formed on another single chip.

However, when the resonators are formed on a single chip, it is possible to form the resonators on a single wafer by a single process (device engineering). Accordingly, it is possible to adjust the film thickness more easily than forming the resonators on separate wafers by separate processes. For example, as illustrated in FIG. 7, since film thicknesses of the films included in the multilayered film 50 are equal to each other in S1 through S4 and P4 through P6 of the first resonators except one layer (here, the additional film 44(Ti) that needs the adjustment of the film thickness), it is possible to form them by a single process. Thus, it is possible to uniform the frequency characteristics of the resonators, and suppress the variability of the frequency interval in the skirt characteristics of the transmission filter and the reception filter. The stability of frequency characteristics at the guard band side is especially demanded to the duplexer with a narrow guard band such as Band 2, it is especially preferable to form the first resonators forming the skirt characteristics at the guard band side on a single chip. In addition, it is also preferable to form the second resonators forming the skirt characteristics at the opposite side to the guard band on a single chip in the same manner as the first resonators.

All the first resonators and second resonators may be formed on a single chip. However, it is necessary to devise the fabrication process when two kinds of resonators having different $k^2_{eff}$ and TCF are formed on the single chip. The above described duplexer may be fabricated by forming the first resonators in a certain region on a chip, masking the first resonators that have been formed, and then forming the second resonator in a rest of the region on the chip.

The first and second embodiments use the piezoelectric thin film resonator of the FBAR type including the space 34 formed below the lower electrode 32 as illustrated in FIG. 3 and FIG. 4, but may use the piezoelectric thin film resonator of the SMR type using a temperature compensation film. The acoustic reflection film is a film formed by stacking a film having a high acoustic impedance and a film having a low acoustic impedance alternately with a film thickness of λ/4 (λ is a wavelength of an acoustic wave), and may be formed below the lower electrode 32 instead of the space 34. Therefore, the temperature compensated type piezoelectric thin film resonator may be the one having a temperature compensation film inserted into the piezoelectric thin film resonator of the FBAR type, and the one having a temperature compensation film inserted into the piezoelectric thin film resonator of the SMR type in the first and second embodiments.

The first and second embodiments use the ladder-type filter illustrated in FIG. 1 as the transmission filter and the reception filter, but may use another type of ladder-type filter having the different number of and the different layout of series resonators and parallel resonators from these embodiments. It is possible to change the number of and the layout of the matching inductors based on the specification of the duplexer.

Although the passband of the transmission filter is on the low frequency side and the passband of the reception filter is on the high frequency side in the duplexer of the first and second embodiments, the passband of the reception filter 12 may be on the low frequency side and the passband of the transmission filter may be on the high frequency side. In addition, the above described embodiments are not limited to the duplexer for Band 2, but may be applied to the duplexer supporting the frequency band other than Band 2.

Although the embodiments of the present invention have been described in detail, it should be understood that the various change, substitutions, and alterations could be made hereto without departing from the spirit and scope of the invention.

What is claimed is:

1. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, second resonators that are the series resonator of the other filter and the parallel resonator of the one filter and are formed on a second chip that is different from the first chip, and wherein a temperature coefficient of frequency of the first resonators is smaller than a temperature coefficient of frequency of the second resonators.

2. The duplexer according to claim 1, wherein an effective electromechanical coupling coefficient of the first resonators is smaller than an effective electromechanical coupling coefficient of the second resonators.

3. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, and second resonators that are the series resonator of the other filter and the parallel resonator of the one filter and are formed on a second chip that is different from the first chip, wherein each of the first resonators is a temperature compensated type piezoelectric thin film resonator that is made of layers including a piezoelectric thin film and lower and upper electrodes facing each other across the piezoelectric thin film, and includes a temperature compensation film having a temperature coefficient of an elastic constant opposite in sign to a temperature coefficient of an elastic constant of the piezoelectric thin film and sandwiched between the upper electrode and the lower electrode, and each of the second resonators is a temperature non-compensated type piezoelectric thin film resonator that is made of layers including a piezoelectric thin film and lower and upper electrodes facing each other across the piezoelectric thin film, and in which a temperature compensation film is not sandwiched between the upper electrode and the lower electrode.

4. The duplexer according to claim 3, wherein the layers of the series resonator included in the first resonators has film thicknesses equal to those of corresponding layers of the parallel resonator included in the first resonators except one layer, and the layers of the series resonator included in the second resonators has film thicknesses equal to those of corresponding layers of the parallel resonator included in the second resonators except one layer.

5. The duplexer according to claim 3, wherein the temperature compensation film mainly includes silicon oxide or silicon nitride.

6. The duplexer according to claim 3, wherein the piezoelectric thin film mainly includes aluminum nitride.

7. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, and second resonators that are the series resonator of the other filter and the parallel resonator of the one filter and are formed on a second chip that is different from the first chip, wherein each of the first resonators is a temperature compensated type piezoelectric thin film resonator that is made of layers including a piezoelectric thin film and lower and upper electrodes facing each other across the piezoelectric thin film, and includes a temperature compensation film having a temperature coefficient of an elastic constant opposite in sign to a temperature coefficient of an elastic constant of the piezoelectric thin film and sandwiched between the upper electrode and the lower electrode, and each of the second resonators is a surface acoustic wave resonator using a lithium tantalate substrate.

8. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, and second resonators that are the series resonator of the other filter and the parallel resonator of the one filter and are formed on a second chip that is different from the first chip, wherein each of the first resonators is a temperature compensated type piezoelectric thin film resonator that is made of layers including a piezoelectric thin film and lower and upper electrodes facing each other across the piezoelectric thin film, and includes a temperature compensation film having a temperature coefficient of an elastic constant opposite in sign to a temperature coefficient of an elastic constant of the piezoelectric thin film and sandwiched between the upper electrode and the lower electrode, and each of the second resonators is a surface acoustic wave resonator using a substrate made by bonding a lithium tantalate substrate on a sapphire substrate.

9. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, and second resonators that are the series resonator of the other filter and the parallel resonator of the one filter and are formed on a second chip that is different from the first chip, wherein each of the first resonators is a temperature compensated type piezoelectric thin film resonator that is made of layers including a piezoelectric thin film and lower and upper electrodes facing each other across the piezoelectric thin film, and includes a temperature compensation film having a temperature coefficient of an elastic constant opposite in sign to a temperature coefficient of an elastic constant of the piezoelectric thin film and sandwiched between the upper electrode and the lower electrode, and each of the second resonators is a Love wave type surface acoustic wave resonator.

10. A duplexer including a transmission filter and a reception filter, a passband of one filter of the transmission filter and the reception filter being lower than a passband of the other of the transmission filter and the reception filter, wherein:

each of the transmission filter and the reception filter includes a series resonator and a parallel resonator connected in a ladder shape, first resonators that are the series resonator of the one filter and the parallel resonator of the other filter and are formed on a first chip, and second resonators that are the series resonator of the other filter and the parallel resonator of the one filter and are formed on a second chip that is different from the first chip, wherein the first chip and the second chip are flip-chip mounted on a mounting substrate.

11. The duplexer according to claim 10, wherein the first resonator and the second resonator included in the transmission filter are electrically connected each other via wirings formed on a die attach layer of the mounting substrate, and the first resonator and the second resonator included in the reception filter are electrically connected via the wirings formed on the die attach layer of the mounting substrate.

* * * * *